United States Patent [19]

Dixon, Jr. et al.

[11] 4,342,010

[45] Jul. 27, 1982

[54] DIELECTRIC WAVEGUIDE POWER LIMITER

[75] Inventors: Samuel Dixon, Jr., Neptune; Harold Jacobs, West Long Branch, both of N.J.

[73] Assignee: The United States of America as represented by the Secretary of the Army, Washington, D.C.

[21] Appl. No.: 153,299

[22] Filed: May 27, 1980

[51] Int. Cl.³ ............................................. H01P 1/23
[52] U.S. Cl. .................................. 333/17 L; 333/219; 455/325
[58] Field of Search ..................... 333/17 L, 239, 219; 455/325, 330

[56] References Cited

U.S. PATENT DOCUMENTS

| | | | |
|---|---|---|---|
| 3,131,366 | 4/1964 | Dixon, Jr. | 333/17 L X |
| 3,500,256 | 3/1970 | Carter et al. | 333/17 L |
| 3,986,153 | 10/1976 | Kuno et al. | 333/239 X |
| 4,016,506 | 4/1977 | Kofol | 333/239 X |
| 4,027,256 | 5/1977 | Dixon | 333/17 L |
| 4,044,357 | 8/1977 | Goldie | 333/17 L X |

*Primary Examiner*—Paul L. Gensler
*Attorney, Agent, or Firm*—Nathan Edelberg; Jeremiah G. Murray; Michael C. Sachs

[57] ABSTRACT

A dielectric waveguide power limiter for a self-oscillating mixer operating on millimeter-wave frequencies. The limiter includes a high resistivity silicon dielectric waveguide and a Gunn oscillator. A plurality of dielectric resonators each including a high uniaxial anisotropy ferrite sphere embedded therein are positioned between the power input end of the waveguide and the Gunn oscillator.

14 Claims, 6 Drawing Figures

DIELECTRIC WAVEGUIDE POWER LIMITER

GOVERNMENT LICENSE

The invention described herein may be manufactured, used and licensed by or for the Government, for Governmental purposes without the payment to me of any royalties thereon.

TECHNICAL FIELD

Broadly speaking, this invention relates to microwave devices. More particularly, in a preferred embodiment, this invention relates to a dielectric waveguide power limiter for use with a self-oscillating mixer operating at millimeter and sub-millimeter wavelengths.

DISCUSSION OF THE PRIOR ART

The self-mixing, Gunn oscillator has attracted considerable attention in recent years because use of this device permits a considerable simplification of the circuitry used in microwave receivers and the like. Conventional Schottky barrier and other rectifier diodes suffer from the disadvantages of fragility and low burnout power levels. On the other hand, bulk effect, self-oscillating mixer using the non-linearity of transferred electron, i.e. Gunn, devices offer competitive sensitivities and the attractive alternative of a higher power handling capability.

As is well known, in conventional mixers there usually exists a source of a signal frequency, a mixer diode of the rectifier type, and a separate local oscillator. In the self-oscillating mixer, however, the mixer diode is eliminated. The Gunn diode serves both as a local oscillator and, because non-linearities are always present in an oscillator, as a mixing element. With the Gunn diode oscillator serving both these functions, receiver front-end design becomes extremely simplified, especially when the dielectric image line approach is used. In the latter arrangement, the signal is fed directly into the oscillator and a suitable intermediate frequency (IF) probe removes the IF power for use in subsequent amplifier stages. What makes the self-mixing oscillators intrinsically different from conventional mixing arrangements using passive devices, such as the Schottky junction diode, is that self-mixing can occur with conversion gain rather than loss, similar to parametric amplification.

Now, in self-oscillating mixers, there is generally an optimum signal power level, with reference to the local oscillator power, for maximizing the transfer of signal power into intermediate frequency power, i.e. the conversion gain. In addition, there is always the possibility that the Gunn diode may burn out if the power level of the incoming signal is in excess of 50 watts (peak) or has a pulse width greater than about 0.5 microseconds.

SUMMARY OF THE INVENTION

It has been discovered that these and other problems can be solved by providing a wide bandwidth power limiter in the self-oscillating mixer. For use with low cost radar receivers, electronic warfare devices, and communication systems operating in the millimeter and sub-millimeter wave frequency ranges (30 to 300 GHz), the invention advantageously comprises a high resistivity dielectric material, such as silicon, as the transmission medium. In a preferred embodiment, the transmission medium includes a plurality of intercoupled dielectric cavity resonators embedded in the transmission medium with a high anisotropy ferrite sphere located in the center of each resonator. Broad band operation is achieved by the proximity coupling of the dielectric resonators while the high anisotropy ferrite spheres act to limit the power level impinging on the self-oscillating mixer diode. A very low DC magnetization field is provided perpendicular to the direction of propagation. The use of small, lightweight, rare earth permanent magnets insures that the instant invention is fully compatible with existing integrated circuit manufacturing techniques.

Now, the high resistivity dielectric waveguides employed with self-oscillating mixers typically have a dielectric constant on the order of 12. On the other hand, the dielectric resonators according to the present invention have a dielectric constant on the order of 1 to 300. This allows the energy propagating in the low dielectric constant waveguide to be readily coupled to the chain of dielectric cavity resonators. This concentration of microwave energy increases the rf power "seen" by the ferrite spheres located in the cavity resonators and consequently reduces the threshold power needed for limiting action. In addition, this structure makes possible the use of high anisotropy uniaxial barium ferrite spheres with a rather broad resonant line width ($\Delta H$). As is well known, the high anisotropy field of barium ferrite spheres is in the order of 17,000 oersteds. Thus, at millimeter and sub-millimeter wave frequencies, this anisotropy, or built-in magnetic field, reduces the external magnetic field requirements to a relatively low value thus permitting use of the invention with integrated circuit technology.

It is thus an object of the instant invention to provide a broad band limiter for a self-oscillating mixer which functions additionally as a millimeter-wave signal power stabilizer. The invention is well suited for use with low cost radar receivers, communications receivers, and electronic warfare systems.

It is a further object of the present invention to provide a millimeter wave sub-system having a relatively flat power response with negligible spike leakage which will operate satisfactorily over a minimum of 20 dB dynamic range.

Yet another object of the present invention is to provide a millimeter wave power limiting device in a dielectric waveguide structure utilizing either ferrite slabs or spheres which are capable of limiting one or more specified frequencies over a wide band of frequencies without the need for any mechanical tuning or the requirement to separate out a narrow band of frequencies from the remainder of the band.

Summarizing the previous discussion, in a preferred embodiment, the instant invention comprises a millimeter wave dielectric waveguide structure including a plurality of high dielectric constant resonators embedded therein.

Small, high anisotropy ferrite spheres are mounted in each resonator with one end of the dielectric waveguide being advantageously tapered for coupling signal power into, and oscillator power out of, the device. A small, rare earth permanent magnet is provided to generate a small biasing field which is perpendicularly oriented with respect to the direction of propogation in the waveguide.

The invention, and its mode of operation, will be more fully understood from the following detailed description when taken with the appended drawings in which:

DETAILED DESCRIPTION OF THE INVENTION

Most low frequency, power limiting devices are fabricated around a non-linear element, typically a ferrite or a diode which is mounted in a coaxial or waveguide structure. However, when working with millimeter and sub-millimeter wave components and circuitry, it quickly became apparent that due to the high costs and high losses at these frequencies, the techniques heretofore used in the microwave region are inapplicable to millimeter waveguides. For these and other reasons, high resistivity silicon is used as the waveguiding structure and as a result propagation can occur with relatively low loss, even through the sub-millimeter frequency region. According to the invention, the millimeter wave power limiter is a passive device which is formed directly in the semi-conductor dielectric waveguide. The device is thus compatible with other active devices which may be fabricated on the semi-conductor surface—a considerable advantage.

As is well known, ferrites have three non-linear physical characteristics that may be utilized for power limiting. These characteristics are known as (1) premature decline of the main resonance; (2) subsidiary resonances; and (3) coincidence of the main resonance with the subsidiary resonance. The first and third ones of these characteristics are applicable to devices that have relatively narrow bandwidths. Generally, ferrite power limiting devices are designed to utilize the subsidiary resonance characteristic because it offers broad bandwidths and sharper frequency selectivity. This characteristic is particularly suited for electronic warfare receivers, and communications receivers that must operate in a dense signal region of the electromagnetic spectrum. In electronic warfare systems, the frequency selective properties of ferrites make it possible to monitor a plurality of signals within the pass band of the receiver and, if one or more monitored signals exceed the limiting threshold, while others do not, the signals that exceed the threshold are limited to the threshold level while the other signals are passed unaffected.

Ferrites used for subsidiary resonance are typically crystalline, ferromagnetic, and non-conductive. Each molecule of the crystal has a magnetic moment and a DC magnetic field is established through the crystal in a direction such that the magnetic moments of the crystal are aligned with the applied magnetic field. Millimeter wave energy traversing the ferrite material causes the magnetic moments to precess relative to the magnetic field direction at a rate which is determined by the strength of the DC magnetic field. The output power is thus directly proportional to the input power, up to a critical threshold power $P_c$.

Figure 1:
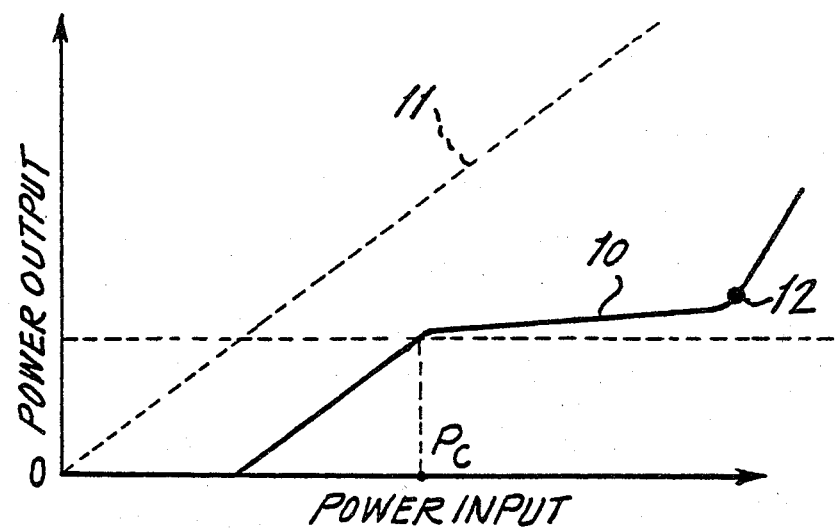
FIG. 1 is a graph showing the output power of a limiter device according to the invention, as a function of input power.

At the critical threshold power, spin waves are generated in the ferrite material and consequently, incident signal energy is absorbed. This non-linear action limits the millimeter wave power output as millimeter wave input power, at any frequency within the passband, increases above the threshold level. This characteristic is illustrated in FIG. 1, wherein the solid line 10 represents the output power of a device according to the invention as a function of the input power while the dashed line 11 represents the power output that would be obtained in the absence of a power limiter according to the invention. It will be observed that the power output increases relatively little above the critical power, $P_c$, for even large increases in power input up to the point 12 where the dynamic range is exceeded. The separation between the lines 10 and 11, below the critical power $P_c$, indicates the insertion loss of the device.

Figure 2:
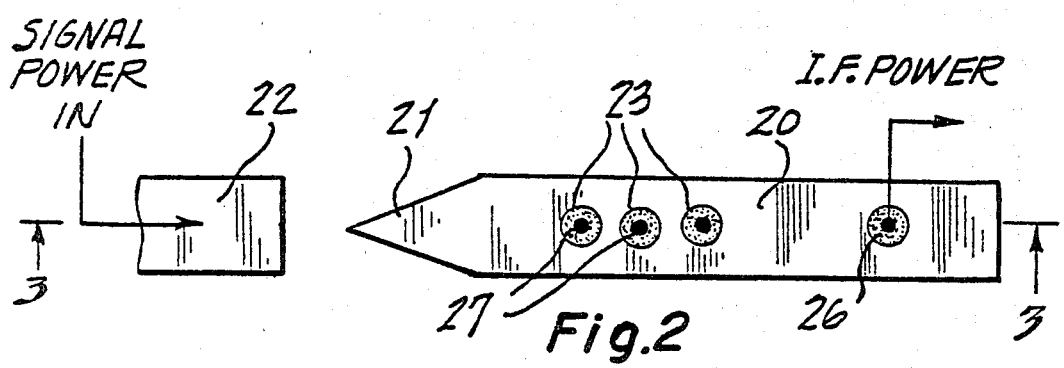
FIG. 2 is a plan view of a first illustrative embodiment of the invention utilizing a plurality of intercoupled cavity resonators located between the input to the device and the self-oscillating mixer.
Figure 3:
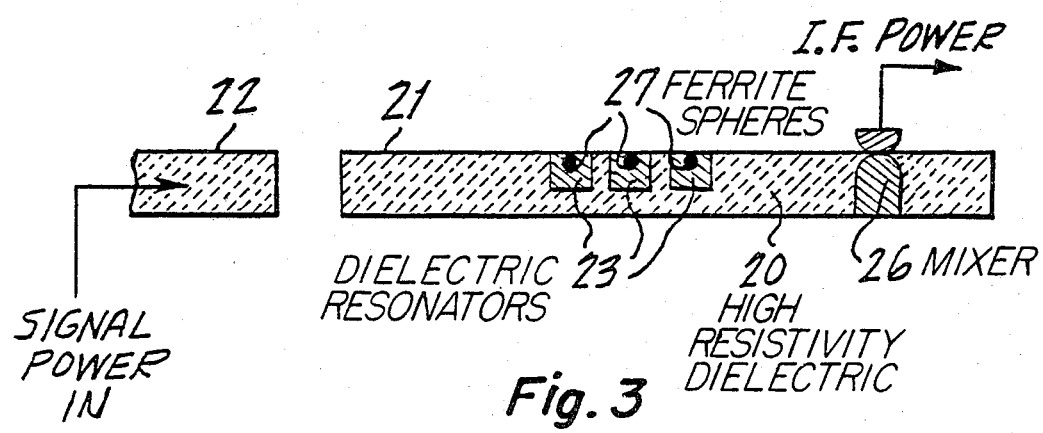
FIG. 3 is a cross-sectional side view of the device shown in FIG. 2.

FIGS. 2 and 3 depict a first illustrative embodiment of the invention. FIG. 3 is a cross-sectional view of FIG. 2 along sectional lines 3—3. As shown, a high resistivity dielectric waveguide 20, e.g. of silicon, has a tapered end section 21 for coupling rf signal power from some suitable external source 22. A plurality of dielectric resonators 23, in the form of short, tubular stubs, are recessed in waveguide 20 at regular intervals between the tapered end section 21 and a self-oscillating mixer 26, e.g. a Gunn diode, also recessed in the waveguide, at which point IF power out is taken and coupled to an IF amplifier. The dielectric resonators 23 may comprise rutile, strontium titanate or the like and each has a high uniaxial anisotropy ferrite sphere 27 embedded symmetrically therein with the easy axis of magnetism aligned perpendicularly to the direction of propagation in the waveguide. The high uniaxial anisotropy exhibited by spheres 27 represents a built-in magnetic field and considerably reduces the strength of the applied DC magnetic field that is necessary to operate the device.

Figure 4:
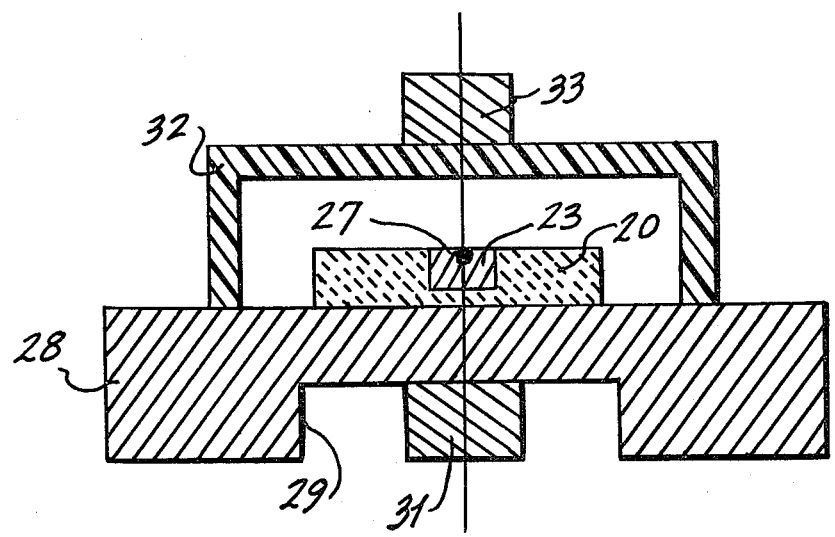
FIG. 4 is a cross-sectional end view of the device shown in FIG. 2 wherein the use of permanent magnets to provide a DC magnetic bias field through the device is illustrated.

FIG. 4 depicts one way that the necessary magnetic bias field may be provided. In this embodiment of the invention, waveguide 20 is placed upon some suitable support member 28, e.g. of brass. Member 28 has an elongated rectangular recess 29 formed in its lower surface for receiving a first, rare-earth permanent magnet 31. A non-conducting, e.g. plastic, U-shaped support member 32 supports a second magnet 33 above, and aligned with, the first magnet 31. Although FIG. 2 depicts resonators 23 as being aligned along the principal longitudinal axis of waveguide 20, a person skilled in the art will appreciate that this is not essential and that other orientations are possible.

In operation, the high dielectric-constant resonators 23 attract the signal energy toward the center of the structure and thus concentrate and intensify the signal power impinging on the ferrite spheres 27 which act to limit any power that exceeds the desired threshold. The DC magnetic field established by magnets 31 and 33 acts to bias the ferrite material to a subsidiary resonance state.

Figure 5:
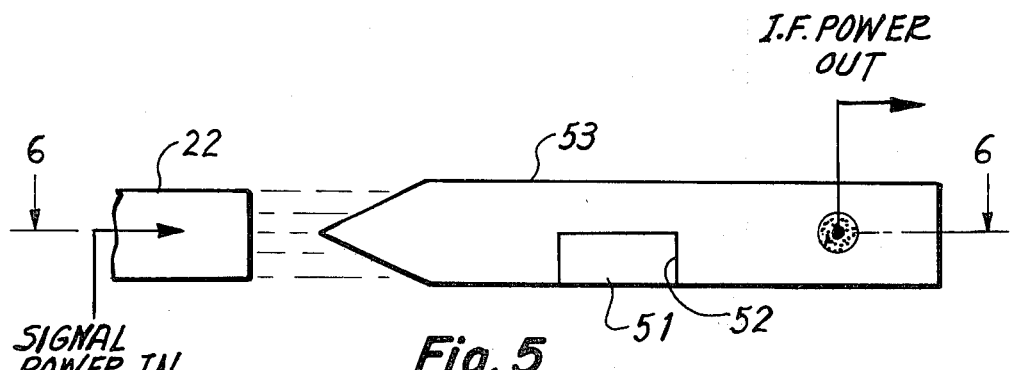
FIG. 5 is a plan view of an alternate embodiment of the invention.
Figure 6:
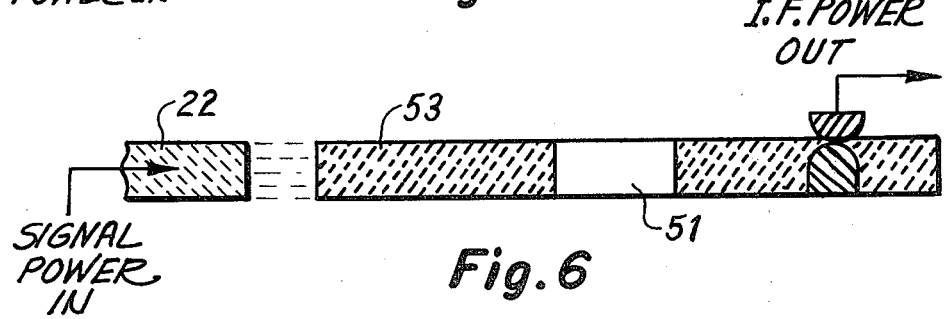
FIG. 6 is a cross-sectional view of the device shown in FIG. 5.

FIGS. 5 and 6 depict another embodiment of the invention in which a slab of ferrite material 51 is positioned within a recess 52 formed in one side of waveguide 53. FIG. 6 is a cross-sectional view of FIG. 5 along section lines 6—6. In all other respects, the operation of this alternate embodiment is similar to the embodiment shown in FIGS. 2-4 and previously described. Again, the exact location of the ferrite slab is not critical. It could, for example, be positioned along the longitudinal axis of the waveguide.

A person skilled in the art can make various changes and substitutions to the layout of parts shown without departing from the spirit and the scope of the invention.

What we claim is:

1. A microwave device, which comprises:
   a high resistivity dielectric waveguide including means for coupling millimeter or sub-millimeter wave microwave energy from an external source into the waveguide;
   a self-oscillating device positioned in said dielectric waveguide; and
   a plurality of high dielectric-constant resonators, comprising ferrite and biased to a subsidiary resonance state, interposed between said energy coupling means and said self-oscillating device for limiting the power fed to said self-oscillating device.

2. The device according to claim 1 wherein each resonator includes a ferrite member of high uniaxial anisotropy with the easy access of magnetism aligned perpendicular to the direction of propagation in the waveguide.

3. The device according to claim 1 further comprising:
   means for establishing a DC magnetic field in said waveguide perpendicular to the direction of propagation in the waveguide.

4. The device according to claim 1 wherein said resonator is comprised of rutile.

5. The device according to claim 1 wherein said resonator is comprised of strontium titanate.

6. The device according to claim 1 wherein said waveguide is comprised of high resistivity silicon.

7. The device according to claim 1 wherein said waveguide is configured as an elongated rectangular member of high resistivity dielectric material and said energy coupling means comprises a tapered extremity in said elongated rectangular member.

8. The device according to claim 1 wherein said resonators comprise a cylindrical recess in said waveguide filled with a material of high dielectric constant.

9. The device according to claim 2 wherein said ferrite member comprises a ferrite bead.

10. The device according to claim 2 wherein said ferrite member comprises barium ferrite.

11. The device according to claim 3 wherein said magnetic field establishing means comprises first and second rare-earth permanent magnets respectively positioned on opposite sides of said waveguide.

12. The device according to claim 2 wherein the magnetic properties of said ferrite members are selected such that said device functions to limit the power of one or more specified frequencies over a wide band of frequencies.

13. A microwave device which comprises:
   a high resistivity dielectric waveguide including means for coupling millimeter or sub-millimeter wave microwave energy from an external source into the waveguide;
   a self-oscillating device positioned in said dielectric waveguide; and
   at least one slab of ferrite material, said ferrite material being biased to a subsidiary resonance state, positioned in said dielectric waveguide intermediate said energy coupling means and said self-oscillating device.

14. The device according to claim 13 wherein said ferrite material comprises barium ferrite.

* * * * *